(12) United States Patent
Zheng et al.

(10) Patent No.: US 7,637,311 B2
(45) Date of Patent: Dec. 29, 2009

(54) HEAT DISSIPATION DEVICE

(75) Inventors: Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 198 days.

(21) Appl. No.: 11/769,664

(22) Filed: Jun. 27, 2007

(65) Prior Publication Data

US 2009/0000768 A1   Jan. 1, 2009

(51) Int. Cl.
*H05K 7/20* (2006.01)

(52) U.S. Cl. .................. 165/80.3; 165/104.33; 361/700; 361/710

(58) Field of Classification Search ............. 165/104.33
See application file for complete search history.

(56) References Cited

U.S. PATENT DOCUMENTS

| | | | | |
|---|---|---|---|---|
| 4,765,397 A | * | 8/1988 | Chrysler et al. | 165/104.33 |
| 5,771,153 A | * | 6/1998 | Sheng | 361/697 |
| 6,062,301 A | * | 5/2000 | Lu | 165/80.3 |
| 6,288,899 B1 | * | 9/2001 | Smith | 361/690 |
| 6,668,915 B1 | * | 12/2003 | Materna | 165/146 |
| 6,935,419 B2 | * | 8/2005 | Malone et al. | 165/185 |
| 7,028,758 B2 | * | 4/2006 | Sheng et al. | 165/104.21 |
| 7,395,851 B2 | * | 7/2008 | Lee et al. | 165/80.3 |
| 2007/0107871 A1 | * | 5/2007 | Xia et al. | 165/80.3 |
| 2007/0107876 A1 | * | 5/2007 | Xia et al. | 165/104.26 |

* cited by examiner

*Primary Examiner*—Allen J Flanigan
(74) *Attorney, Agent, or Firm*—Frank R. Niranjan

(57) ABSTRACT

A heat dissipation device for at least two heat-generating electronic components, includes a base for contacting with the heat-generating electronic components, a first fin set arranged on one part of the base, a second fin set arranged on another part of the base and at least a heat pipe sandwiched between the base and the first and second fin sets. The first fin set includes a plurality of fins defining a plurality of air passages therebetween. The second fin set includes a plurality of fins. Every two neighboring fins define therebetween an air passage communicating with a corresponding air passage of the first fin set. A channel which is parallel to and has a width larger than that of the air passages of the first and second fin sets is defined in a middle of the second fin set.

8 Claims, 3 Drawing Sheets

HEAT DISSIPATION DEVICE

BACKGROUND OF THE INVENTION

1. Field of the Invention

The present invention relates generally to a heat dissipation device, and more particularly to a heat dissipation device for removing heat from heat-generating electronic components.

2. Description of Related Art

Electronic component includes numerous circuits operating at high speed and generating substantive heat. In many applications, it is desirable to employ a heat sink to remove heat from the heat-generating electronic components, such as central processing units (CPUs) etc., to assure that the components function properly and reliably. A typical heat sink comprises a base for contacting with the heat-generating component to absorb the heat generated by the heat-generating component and a plurality of parallel planar fins attached to the base by soldering or adhering. Alternatively, the fins can be integrally formed with the base by metal extrusion, such as aluminum extrusion. The fins are used for dissipating the heat from the base to ambient air.

With the development of various types of electronic modules, an array of many discrete heat-generating components may be mounted to a surface of a single circuit board and a mass of digital electronic products and systems become more and more compacted and portable in configuration. As a result, spacing between the heat-generating components has been decreased dramatically, which makes it impossible to provide each heat-generating component with an individual heat sink. Additionally, it is both expensive and time-consuming to attach individual heat sink to each of the heat-generating components. A conventional thermal resolution is to provide with one heat dissipation device capable of cooling at least two discrete heat-generating components simultaneously. The heat dissipation device typically includes a base contacting with the heat-generating components and a plurality of fins vertically standing on the base. The fins are spaced from each other with a predetermined distance, and define a plurality of air passages therebetween. To meet a higher need of heat dissipation, a fan is mounted to a lateral side of the heat dissipation device and faces to inlets of the air passages between the fins. However, in order to simultaneously connect with the at least two heat-generating components, the base and the fins are so elongated that an air resistance in the air passages is very large. Therefore, the flow rate of the airflow generated by the fan decreases gradually from the inlet to an outlet of the air passage when the airflow flows through the heat dissipation device. Accordingly, cooling capabilities of the heat dissipation device for the heat-generating components are different. Thus, difference in temperature occurs in the heat-generating components and the heat-generating component, which is remote from the fan may have a too high temperature to function normally.

What is needed is a heat dissipation device with an improved structure and able to cool an array of heat-generating components.

SUMMARY OF THE INVENTION

The present invention relates to a heat dissipation device for at least two heat-generating electronic components, includes a base contacting with the two heat-generating electronic components, a first fin set vertically arranged on one part of the base, a second fin set vertically arranged on another part of the base and at least a heat pipe sandwiched between the base and the first and second fin sets. The first fin set includes a plurality of fins, with every two neighboring fins defining an air passage therebetween. The second fin set includes a plurality of fins, with every two neighboring fins defining an air passage therebetween, which communicates with a corresponding air passage of the first fin set. A channel which is parallel to and has a width larger than that of the air passage of the first and second fin sets is defined in a middle of the second fin set, whereby an airflow generated by a fan located at a side of the second fin set distant from the first fin set can easily flow to the first fin set via the second fin set.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
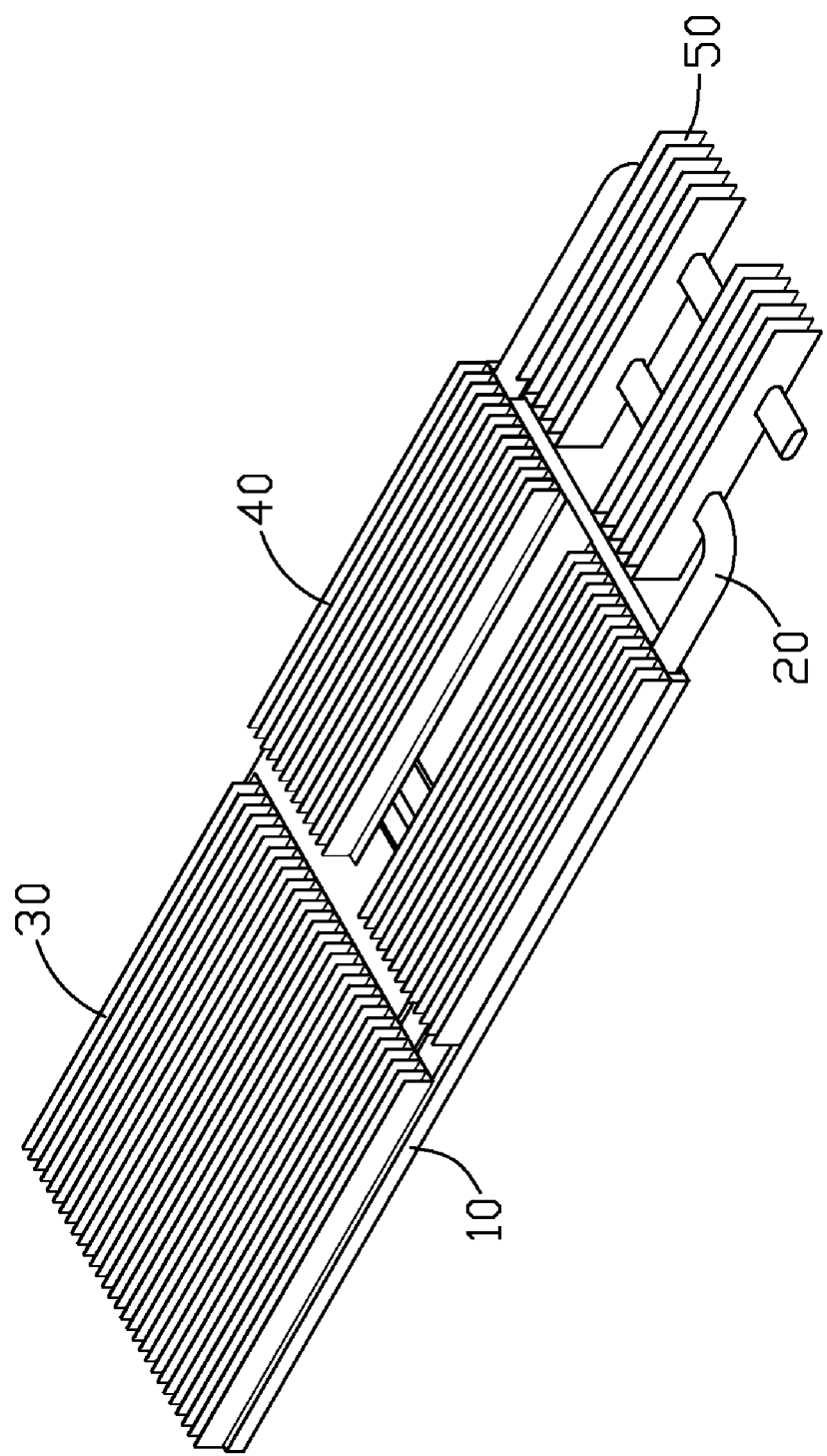
FIG. 1 is an assembled view of a heat dissipation in accordance with a preferred embodiment of the present invention.
Figure 2:
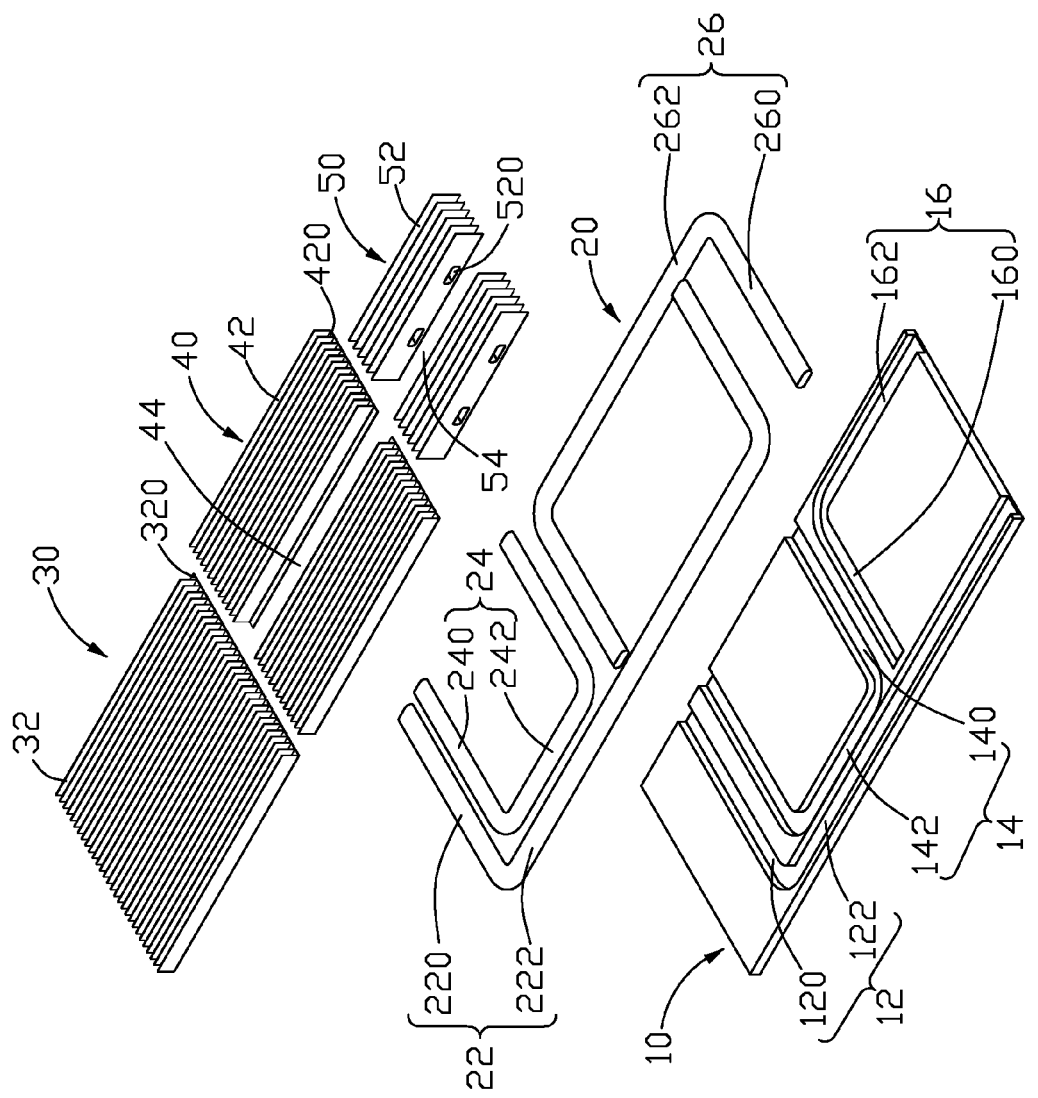
FIG. 2 is an exploded, isometric view of the heat dissipation device of FIG. 1
Figure 3:
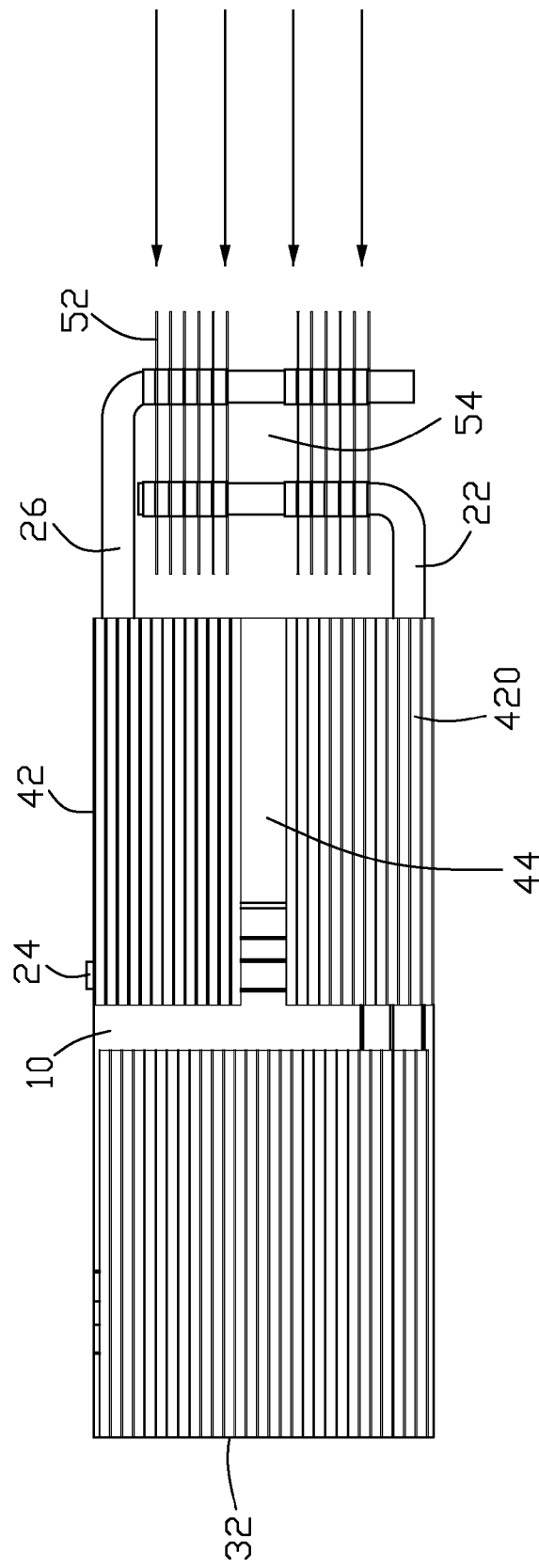
FIG. 3 is a top view of the heat dissipation device of FIG. 1.

Referring to FIGS. 1-3, a heat dissipation device in accordance with a preferred embodiment of the present invention is shown. The heat dissipation device is mounted to two heat-generating electronic components (not shown), for example two heat-generating sources (cores) of a dual-core CPU (not shown), for dissipating heat therefrom. The heat dissipation device comprises a base plate 10, a heat pipe assembly 20 partially embedded in the base plate 10, a first fin set 30 vertically standing on one end of the base plate 10, a second fin set 40 vertically standing on another end of the base plate 10 and a third fin set 50 located at a lateral side of the base plate 10, neighboring the second fin set 40 and thermally coupled to the base plate 10 by the heat pipe assembly 20.

The base plate 10 is formed by die casting of a good heat conductivity material such as aluminum and copper. The base plate 10 is rectangular and defines a plurality of receiving grooves in a top surface thereof. In this embodiment, the receiving grooves include a first groove 12, a second groove 14 and a third groove 16.

The first groove 12 is substantially L-shaped and comprises a first receiving portion 120 perpendicular to a long side of the base plate 10 and a first extending portion 122 extending perpendicularly from a end of the first receiving portion 120. The first receiving portion 120 is located adjacent to an end of the base plate 10, aligned with one of the two heat-generating electronic components and a middle portion of the first fin set 30 and located therebetween. The first extending portion 122 extends along and is adjacent to one of the long sides of the base plate 10.

The second groove 14 is substantially U-shaped and comprises two spaced second receiving portions 140 parallel to the first receiving portion 120 of the first groove 12 and a second extending portion 142 interconnecting perpendicularly the two second receiving portions 140. One of the second receiving portions 140 is neighboring to and parallel to the first receiving portion 120 of the first groove 12, and the other one of the second receiving portions 140 is located corresponding to the other one of the heat-generating electronic elements. The second extending portion 142 is neighboring to and parallel to the first extending portion 122 of the first groove 12.

The third groove 16 is substantially L-shaped and comprises a third receiving portion 160 perpendicular to the long sides of the base plate 10 and a third extending portion 162 extending perpendicularly from an end of the third receiving portion 160. The third receiving portion 160 extends along and is adjacent to the other one of the second receiving portions 140 of the second groove 14, which is remote from the first receiving portion 120 of the first groove 12. The third extending portion 162 extends along and is adjacent to the other one of the long sides of the base plate 10, which is remote from the first extending portion 122 of the first groove 12.

The heat pipes assembly 20 which is composed of a plurality of flatten, U-shaped heat pipes, includes a first heat pipe 22, a second heat pipe 24 and a third heat pipe 26. The first heat pipe 22 comprises two parallel first conducting sections 220 and a first connecting section 222 perpendicularly interconnecting the two first conducting sections 220.

The second heat pipe 24 comprises two parallel second conducting sections 240 and a second connecting section 242 perpendicularly interconnecting the two second conducting sections 240. The second heat pipe 24 has a configuration perfectly fitted to the second groove 14 of the base plate 10. The third heat pipe 26 comprises two parallel third conducting sections 260 and a third connecting section 262 perpendicularly interconnecting the two third conducting sections 260.

The first fin set 30 comprises a plurality of first fins 32 parallel to each other. The first fins 32 are spaced from each other with a predetermined distance and define a plurality of air passages 320 therebetween. Each first fin 32 has a flange (not labeled) bended perpendicularly from a lower edge thereof. All the flanges of the first fins 32 cooperatively define a coplanar contacting surface to couple to the top surfaces of the heat pipes 22, 24 and the base plate 10.

The second fin set 40 comprises a plurality of second fins 42 parallel to the first fins 32. The second fins 42 are spaced from each other with a predetermined distance and define a plurality of air passages 420 therebetween. Each second fin 42 has a flange (not labeled) bended perpendicularly from a lower edge thereof. All the flanges of the second fins 42 cooperatively define a plane contacting surface to couple to the top surfaces of the heat pipes 22, 24, 26 and the base plate 10. A channel 44 parallel to the air passages 420 is defined in a middle of the second fin set 40. The channel 44 has a width larger than that of the air passage 420 for allowing airflow entering the second fin set 40 to flow into the first fin set 30 directly without being unduly blocked by the second fin set 40. The first fin set 30 is spaced from the second fin set 40 by a transverse passage (not labeled), which is perpendicular to and communicates with the channel 44 of the second fin set 40. All the first and second fins 32, 42 are arranged in a direction perpendicular to the conducting sections 220, 240, 260 of the heat pipes 22, 24, 26 embedded in the base plate 10.

The third fin set 50 is located at the lateral side of the base plate 10 proximal to the second fin set 40 and comprises a plurality of third fins 52 parallel to the second fins 42. The third fins 52 are spaced from each other with a predetermined distance and define a plurality of air passages (not labeled) therebetween. The third fins 52 each define two spaced through holes 520 therein and have collars (not labeled) extending perpendicularly and outwardly from edges of the through holes 520. The through holes 520 cooperate with the corresponding collars to form two receiving passages for receiving a corresponding one of the first conducting sections 220 of the first heat pipe 22 and a corresponding one of the third conducting sections 260 of the third heat pipe 26 therein. The third fin set 50 defines a channel 54 in a middle thereof. The channel 54 is aligned and communicates with the channel 44 of the second fin set 40. As the third fins 52 are less in quantity and smaller in size than the first and second fins 32, 42, the air passages of the third fin set 50 each have a width wider than that of the first and second fin sets 30, 40. Thus, an air resistance in the third fin set 50 against the airflow flowing therethrough is smaller than that of the first and second fin sets 30, 40. The second and third fin sets 40, 50 are separated from each other by a passage (not shown) at the lateral side of the base 10, and the passage is perpendicular to and communicates with the channels 44, 54 of the second and third fin sets 40, 50.

In assembly of the heat dissipation device, one of the first conducting sections 220 of the first heat pipe 22 is received in the first receiving portion 120 of the first groove 12 of the base plate 10, and the other one of the first conducting sections 220 of the first heat pipe 22 is engagingly received in a corresponding one of the two receiving passages of the third fin set 50 at the lateral side of the base plate 10. Most part of the first connecting section 222 of the heat pipe 22 is received in the first extending portion 122 of the first groove 12 of the base plate 10 while the remaining part extends outwardly from the first groove 12. The two second conducting sections 240 of the second heat pipe 24 and the second connecting section 242 of the second heat pipe 24 are respectively received in the corresponding two second receiving portions 140 and the second extending portion 142 of the second groove 14 of the base plate 10. One of the third conducting sections 260 of the third heat pipe 26 is received in the third receiving portion 160 of the third groove 16 of the base plate 10, and the other one of the third conducting sections 260 is received in a corresponding receiving passage of the third fin set 50 at the lateral side of the base plate 10. Most part of the third connecting section 262 of the third heat pipe 26 is received in the third extending portion 162 of the third groove 16 of the base plate 10 while the remaining part extends outwardly from the third groove 16. Top surfaces of the heat pipes 22, 24, 26 received in the corresponding grooves 12, 14, 16 of the base plate 10 level with the top surface of the base plate 10 to form a contacting surface. The first and second fin sets 30, 40 are coupled to the contacting surface and separated from each other by the passage at a middle of the base plate 10.

In use of the heat dissipation device, heat generated by the two heat-generating electronic components is absorbed by the base plate 10, and transferred to the first, second and third fin sets 30, 40, 50 and then brought into ambient by airflow passing through the first, second and third fin sets 30, 40, 50. The first, second and third fin sets 30, 40, 50 are thermally connected with each other and the airflow generated by a fan (not shown) located at a lateral side of the third fin set 50 flows through the channels 54, 44 of the third and second fin sets 50, 40 to enter the first fin set 30 without being unduly blocked. Thus, the heat dissipation device is able to provide consistent cooling capability for the two heat-generating electronic components.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for simultaneously dissipating heat generated by at least two heat-generating electronic components, comprising:
   a base adapted for contacting with the at least two heat-generating electronic components;
   a first fin set vertically arranged on one part of the base and comprising a plurality of fins, every two neighboring fins defining an air passage therebetween;
   a second fin set vertically arranged on another part of the base and comprising a plurality of fins, every two neighboring fins defining an air passage therebetween, which communicates with a corresponding air passage of the first fin set;
   at least a heat pipe sandwiched between the base and the first and second fin sets; wherein a channel being parallel to and having a width larger than that of the air passages of the first and second fin sets is defined in a middle of the second fin set; and
   a third fin set located at a lateral side of the base and proximal to the second fin set;
   wherein the third fin set is thermally connected to the first and second fin sets by the at least a heat pipe; and
   wherein the third fin set defines at least a receiving passage receiving a portion of the at least a heat pipe therein.

2. The heat dissipation device of claim 1, wherein the third fin set defines a channel in a middle thereof, and the channel of the third fin set is in line and communicates with the channel of the second fin set.

3. The heat dissipation device of claim 2, wherein the third fin set comprises a plurality of third fins, and every two neighboring third fins define an air passage therebetween.

4. The heat dissipation device of claim 3, wherein the air passages of the third fin set each have a width larger than that of each of the air passages of the second fin set, and the channel of the third fin set has a width larger than that of the channel of the second fin set.

5. The heat dissipation device of claim 1, wherein the first and second fin sets are separated from each other by a passage in a middle of the base, and the passage is perpendicular to and communicates with the channel of the second fin set.

6. A heat dissipation device for simultaneously dissipating heat generated by at least two heat-generating electronic components, comprising:
   a base adapted for contacting with the two heat-generating electronic components;
   a first fin set vertically arranged on one part of the base and comprising a plurality of fins, every two neighboring fins defining an air passage therebetween;
   a second fin set vertically arranged on another part of the base and comprising a plurality of fins parallel to the fins of the first fin set, every two neighboring fins of the second fin set defining therebetween an air passage communicating with a corresponding air passage of the first fin set, a channel which is parallel to and larger in size than the air passage of the second fin set being defined in a middle of the second fin set;
   a third fin set located at a lateral side of the base and the second fin set and comprising a plurality of fins parallel to the fins of the first fin set, every two neighboring fins of the third fin set defining an air passage communicating with a corresponding air passage of the second fin set, the third fin set further comprising a channel communicating with the channel of the second fin set and having a width larger than that of the channel of the second fin set; and
   a plurality of heat pipes thermally connecting the first, second and third fin sets together;
   wherein the third fin set defines at least a receiving passage receiving a portion of at least a heat pipe of the heat pipes therein and the at least a heat pipe simultaneously thermally connects with the first, second and third fin sets.

7. The heat dissipation device of claim 6, wherein the plurality of pipes comprises three U-shaped heat pipes each having two conducting sections perpendicular to all of the fins, air passages and channels, a connecting section perpendicularly interconnecting the two conducting sections.

8. The heat dissipation device of claim 6, wherein the conducting sections of the heat pipes are attached respectively and thermally to corresponding fin sets.

* * * * *